(12) United States Patent
Deloge et al.

(10) Patent No.: US 9,355,056 B2
(45) Date of Patent: May 31, 2016

(54) COMMUNICATION APPARATUS WITH SLEW RATE FEEDBACK

(71) Applicant: NXP B.V., Eindhoven (NL)

(72) Inventors: Matthieu Deloge, Waalre (NL); Arnoud Pieter van der Wel, Vught (NL)

(73) Assignee: NXP B.V., Eindhoven (NL)

( * ) Notice: Subject to any disclaimer, the term of this patent is extended or adjusted under 35 U.S.C. 154(b) by 568 days.

(21) Appl. No.: 13/924,034

(22) Filed: Jun. 21, 2013

(65) Prior Publication Data

US 2014/0375359 A1 Dec. 25, 2014

(51) Int. Cl.
| | |
|---|---|
| *G06F 13/42* | (2006.01) |
| *G06F 13/40* | (2006.01) |
| *G06F 13/38* | (2006.01) |
| *H03K 19/003* | (2006.01) |
| *H04L 25/02* | (2006.01) |
| *H04L 25/08* | (2006.01) |

(52) U.S. Cl.
CPC .......... *G06F 13/4072* (2013.01); *G06F 13/385* (2013.01); *H03K 19/00338* (2013.01); *H03K 19/00369* (2013.01); *H04L 25/028* (2013.01); *H04L 25/0286* (2013.01); *H04L 25/08* (2013.01)

(58) Field of Classification Search
USPC .................................. 710/104–110, 305–315
See application file for complete search history.

(56) References Cited

U.S. PATENT DOCUMENTS

| 6,047,346 | A | 4/2000 | Lau et al. | |
|---|---|---|---|---|
| 6,959,014 | B2 * | 10/2005 | Pohlmeyer | H04L 7/044 370/503 |
| 7,688,113 | B2 | 3/2010 | Nascimento et al. | |
| 8,334,758 | B2 * | 12/2012 | Baruco | B60R 25/245 340/12.1 |
| 8,487,663 | B2 * | 7/2013 | Redoute | H03K 5/12 327/108 |
| 8,612,657 | B2 * | 12/2013 | Lance | H04L 12/403 710/110 |
| 2005/0285647 | A1 | 12/2005 | Wilson et al. | |
| 2006/0152261 | A1 * | 7/2006 | Lance | H04L 25/0292 327/170 |
| 2008/0164924 | A1 | 7/2008 | Bucossi et al. | |

FOREIGN PATENT DOCUMENTS

| EP | 1376962 A1 | 1/2004 |
|---|---|---|
| WO | 2013/110019 A1 | 7/2013 |

OTHER PUBLICATIONS

Hardware Requirements for LIN, CAN and FlexRay Interfaces in Automotive Applications, Audi; BMW; Daimler; Porsche & Volkswagen, rev 1.2, Mar. 25, 2011.
An EMI Resisting LIN Driver in 0.35-micron High-Voltage CMOS, Redoute, J. M. and Steyaert, M., IEEE Journal of Solid-State Circuits, vol. 42, pp. 1574-1582, 2007.
LIN specification package, LIN consortium, rev 2.2a, 2010.
Extended European Search Report for European Patent Appln. No. 14172680.2 (Nov. 19, 2014).

\* cited by examiner

*Primary Examiner* — Raymond Phan
(74) *Attorney, Agent, or Firm* — Rajeev Madnawat (57) ABSTRACT

In accordance with one or more example aspects of the disclosure, communications are effected on a bus using bit time and slew rate feedback. As consistent with one or more embodiments, communications are effected in a network including a master circuit and a plurality of slave circuits, on bus that is controlled by the master circuit corresponding to master and slave data communication. A feedback signal is provided, which is indicative of a slew rate and bit time of signals communicated between the master and slave circuits on the bus. Data is transmitted on the bus by generating output signals via a waveform corresponding to an input signal, and controlling the waveform based upon the slew rate and bit time indicated via the feedback signal.

19 Claims, 6 Drawing Sheets

COMMUNICATION APPARATUS WITH SLEW RATE FEEDBACK

Aspects of various embodiments are directed to communications, such as transceiver-based communications involving feedback control.

A variety of communication networks are used in different applications and environments. For example, industrial, automotive, and other industries have used communications networks to facilitate the control of and/or communication between various devices. These communication networks have been increasingly used to suit various needs. In particular, the automotive industry has seen increased use of network communications for a variety of uses, such as for controlling communication circuits relating to the operation of a vehicle.

One type of communication network that is being increasingly used for various applications is a LIN (local interconnect network). A LIN includes a master and a number of slaves connected in a series cascade arrangement for communication over a single wire interface, which can be based on a standard UART (Universal Asynchronous Receiver Transmitter). The network is time-triggered and controlled by a master circuit that includes a scheduler and multiple slaves that communicate in accordance with the master. The slave ("addressed" by the header) completes the message by inserting the response field.

Transceivers insure the proper transmission and reception of data from the bus. However, transceivers are susceptible to variations in operation, as may be due to electromagnetic interferences and changes in bus characteristics (e.g., due to component connectivity). These variations can cause undesirable operation of the transceivers and/or bus.

These and other issues continue to present challenges to the implementation of circuits in a variety of applications, and in particular to applications utilizing communication components and networks such as those used in a LIN.

Various example embodiments are directed to communication circuits and their implementation.

According to an example embodiment, an apparatus operates for communicating in a network including a master circuit and a plurality of slave circuits, on bus that is controlled by the master circuit corresponding to master and slave data communication. The apparatus includes a feedback circuit and a data-transmission circuit. The feedback circuit provides a feedback signal indicative of a slew rate and bit time of signals communicated in the network between the master and slave circuits on the bus. The data-transmission circuit communicates data over the bus using control provided by the master circuit, and is responsive to an input signal and a feedback signal received from the feedback circuit to transmit data on the bus by generating output signals via a waveform corresponding to the input signal, and controlling the waveform based upon the slew rate and bit time on the bus and indicated via the feedback signal.

Another embodiment is directed to an apparatus having a wave-shaping circuit that generates signals via an output waveform and transmits the generated signals on a bus. A slew-rate detection circuit detects a fall time and rise time of signals carried on the bus, which are indicative of a slew rate of the signals. A comparator circuit provides a bit time of signals received from the bus. A control logic circuit receives and uses data indicative of the detected fall time, rise time and bit time to control the wave-shaping circuit to generate the signals based on: a transmission signal to be transmitted on the bus, a slew rate associated with one of the detected fall time and the detected rise time, and a comparison of the detected bit time with a reference bit time of signals transmitted via the apparatus on the bus.

Various other embodiments are directed to apparatuses, methods and systems, consistent with the above embodiments.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure, including aspects defined in the claims. In addition, the term "example" as used throughout this application is only by way of illustration, and not limitation.

Aspects of the present disclosure are believed to be applicable to a variety of different types of apparatuses, systems and methods involving communications. While not necessarily so limited, various aspects may be appreciated through a discussion of examples using this context.

Various example embodiments are directed to the transmission of signals on a single-wire bus as may be implemented in a shared-bus environment, such as a LIN bus, using slew rate and bit time feedback to control the transmission. In some embodiments, a LIN transceiver uses the slew rate and bit time feedback to compensate for variations in the communications due to characteristics of the bus, such as may relate to devices connected to the bus, to accurately control an output waveform on which signals are communicated on the bus. These approaches can be used to achieve performance in terms of both low electromagnetic emission and high electromagnetic immunity, which can be useful in a variety of applications such as those involving automotive communications susceptible to deviations in bus characteristics (e.g., timing deviations due to the injection of RF disturbances).

A more particular embodiment is directed to a closed-loop LIN transceiver that uses bus-feedback to provide information from the bus to a controller. Bus-load variations can be compensated for, such that a slowest-allowed slew-rate specified for various specifications via which the bus is operated can be used. Further, desirable/optimum low-electromagnetic energy performance can therefore be achieved for various bus impedances. The feedback approach also ensures that an appropriate bit time is obtained on an output signal for any injected RF level and frequency, via comparison with a bit time of input/transmitted signals.

According to another example embodiment, an apparatus operates for communicating in a network including a master circuit and a plurality of slave circuits, on bus that is controlled by the master circuit corresponding to master and slave data communication. The apparatus may, for example, be implemented in one or more of the master and slave circuits, to effect communications from the circuit in which the apparatus resides. A feedback circuit provides a feedback signal indicative of a slew rate and bit time of signals communicated in the network between the master and slave circuits on the bus. A data-transmission circuit communicates data over the bus using control provided by the master circuit, as may be implemented within the master circuit or one of the slave circuits, with the latter being responsive to communications by a master circuit on the bus. The data-transmission circuit is responsive to an input signal to be communicated on the bus, and a feedback signal received from the feedback circuit, by generating output signals carrying data for transmission on the bus, via a waveform corresponding to the input signal. The data-transmission circuit controls the waveform based upon the slew rate and bit time (e.g., based upon deviations therein) on the bus and indicated via the feedback signal.

In some implementations, the apparatus detects changes in bit time by comparing the detected bit time of a signal carried on the bus and transmitted by the apparatus, with a bit time of the signal as presented to the apparatus for transmission. The feedback signal may, for example, be generated to include/ indicate this bit time comparison, or may provide a detected bit time of the transmitted signal on the bus, which can be used by the data-transmission circuit to effect the comparison. For instance, the feedback circuit and/or data-transmission circuit may compare a bit time of one of the signals on the bus with a reference bit time that is derived from a data signal transmitted by the data-transmission circuit on the bus (e.g., with the feedback signal being responsive to impedance changes on the bus).

In some embodiments, the feedback circuit detects the fall time, the bit time and the rise time of signals carried on the bus during the transmission of a bit, and provides the feedback signal to drive the data-transmission circuit to control the output waveform as follows. In response to the rise time being shorter than a reference value, the data-transmission circuit transmits a bit by increasing the amplitude of current used to drive the output waveform by a first step value. In response to the fall time being shorter than the reference value, the data-transmission circuit transmits a first bit by decreasing the amplitude of the current used to drive the output waveform by the first step value. Upon transmission of the first bit, the data-transmission circuit detects one of the rise time and the fall time of a signal carrying the bit, and adjusts the amplitude of current used to drive the output waveform based upon the one of the rise time and the fall time of the signal carrying the bit.

In a more particular embodiment, the feedback circuit includes a receiver circuit that receives signals passed on the bus, and a slew-rate detector circuit that detects a slew-rate of signals carried on the bus. The receiver circuit may, for example, include a low-pass filter and a voltage comparator that receive signals passed on the bus, and compare the bit time of the respective signals. The data-transmission circuit further includes a wave shaping circuit that controls the output waveform, and a control logic block that drives the wave shaping circuit to adjust the output waveform based upon the detected slew-rate of a signal carried on the bus. In some embodiments, the apparatus includes a bit time detector that compares the bit time on received signals with the bit time of signals transmitted by the data-transmission circuit. The bit-time detector may, for example, be separate or integrated with one or both of the feedback circuit and the data-transmission circuit. The control logic block drives the wave shaping circuit in response to the comparison.

In some implementations, the data-transmission circuit compensates for bus-load variations by controlling the output waveform to facilitate communications on the bus based on a predefined slew-rate threshold. In other implementations, the data-transmission circuit adjusts the output waveform based upon bit time characteristics to set a bit time of the generated signals that remains constant during high frequency interference on the bus.

Another embodiment is directed to an apparatus having a wave-shaping circuit, a slew-rate detection circuit, a comparator circuit, and a control logic circuit. The wave-shaping circuit generates signals via an output waveform, and transmits the generated signals on a bus. The slew-rate detection circuit detects a fall time and rise time of signals carried on the bus, which are indicative of a slew rate of the signals. The comparator circuit provides a bit time of signals received from the bus, and the control logic circuit receives and uses data indicative of the detected fall time, rise time and bit time in order to control the wave-shaping circuit to generate the signals. This control is based on: a transmission signal to be transmitted on the bus, a slew rate associated with one of the detected fall time and the detected rise time, and a comparison of the detected bit time with a reference bit time of signals transmitted via the apparatus on the bus. Such an approach may, for example, be implemented in a master or slave device connected on a single-wire bus or other bus as described herein.

Various method-based embodiments are directed to providing feedback signals indicative of a slew rate and bit time of signals communicated on a master-slave bus as described herein, in which data is transmitted on the bus by generating output signals via a waveform corresponding to the input signal. The waveform is controlled based upon the slew rate and bit time on the bus and indicated via the feedback signal. This approach may be implemented, for example, by detecting the fall time, bit time and rise time of signals carried on the bus during the transmission of a bit. For instance, when the rise time is shorter than a reference value, a subsequent bit is transmitted by increasing the amplitude of current used to drive the output waveform by a first step value. When the fall time is shorter than the reference value, the subsequent bit is transmitted by decreasing the amplitude the current used to drive the output waveform by the first step value. The rise and/or fall time of the subsequent bit can be detected and used to further adjust the amplitude of current used to generate the waveform for a later-transmitted bit or bits.

Figure 1:
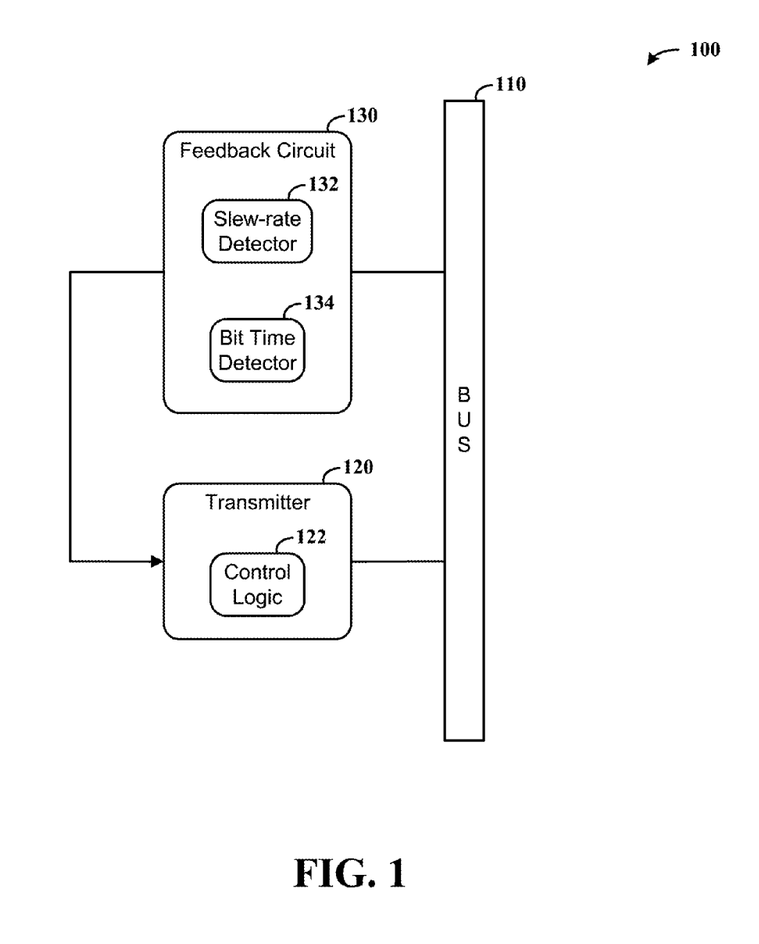
FIG. 1 shows a transceiver apparatus, in accordance with an example embodiment of the present invention.

Turning now to the figures, FIG. 1 shows a transceiver apparatus 100 for communications on a bus 110, in accordance with another example embodiment of the present invention. The apparatus 100 includes a transmitter 120 and a feedback circuit 130. The feedback circuit 130 provides a feedback signal to the transmitter 120, in which the feedback signal is indicative of a slew rate and bit time of signals transmitted on the bus 110. The transmitter 120 includes a control logic circuit 122 that uses the feedback signal to transmit signals on the bus, based upon the indicated slew rate and bit time. For example, the transmitter may transmit data by generating output signals via a waveform corresponding to an input signal (to be communicated on the bus 110), and controlling the waveform based upon the slew rate and bit time indicated via the feedback signal.

In some embodiments, the apparatus 100 is implemented for communicating on a single-wire bus having a master circuit and a plurality of slave circuits connected in series on the bus, in which the master circuit controls all communications (e.g., by initiating a communication to which slave circuits respond). The apparatus 100 is implemented in one of the master or slave circuits. In some implementations, two or more of the master and slave circuits include an apparatus 100 as shown in FIG. 1. In still other embodiments, the apparatus 100 is used on a differential or a pseudo-differential network, with two such apparatuses, one each used on high and low wires of the network.

In a more particular embodiment, the feedback circuit 130 includes a slew-rate detector 132 and bit time detector 134. The slew-rate detector detects a slew rate of signals carried on the bus 110. The bit time detector 134 (e.g., including a comparator) provides an indication of a bit time of signals carried on the bus, and in some implementations, compares the bit time of a signal carried on the bus with a bit time of that signal prior to transmission on the bus by the transmitter 120.

The feedback circuit 130 is implemented using one or more of a variety of approaches, to suit particular applications. For example, the feedback circuit 130 may be implemented in accordance with one or more of the above-described embodiments, or others as described below and/or shown in other figures. In one such embodiment, the feedback circuit detects the fall time, the bit time and the rise time of signals carried on the bus and transmitted by the transmitter 120, and provides a feedback signal to drive transmitter 120. The transmitter 120 transmits additional signals on the bus 110 based upon slew rate differences and/or bit time deviations as indicated via the feedback.

Figure 2:
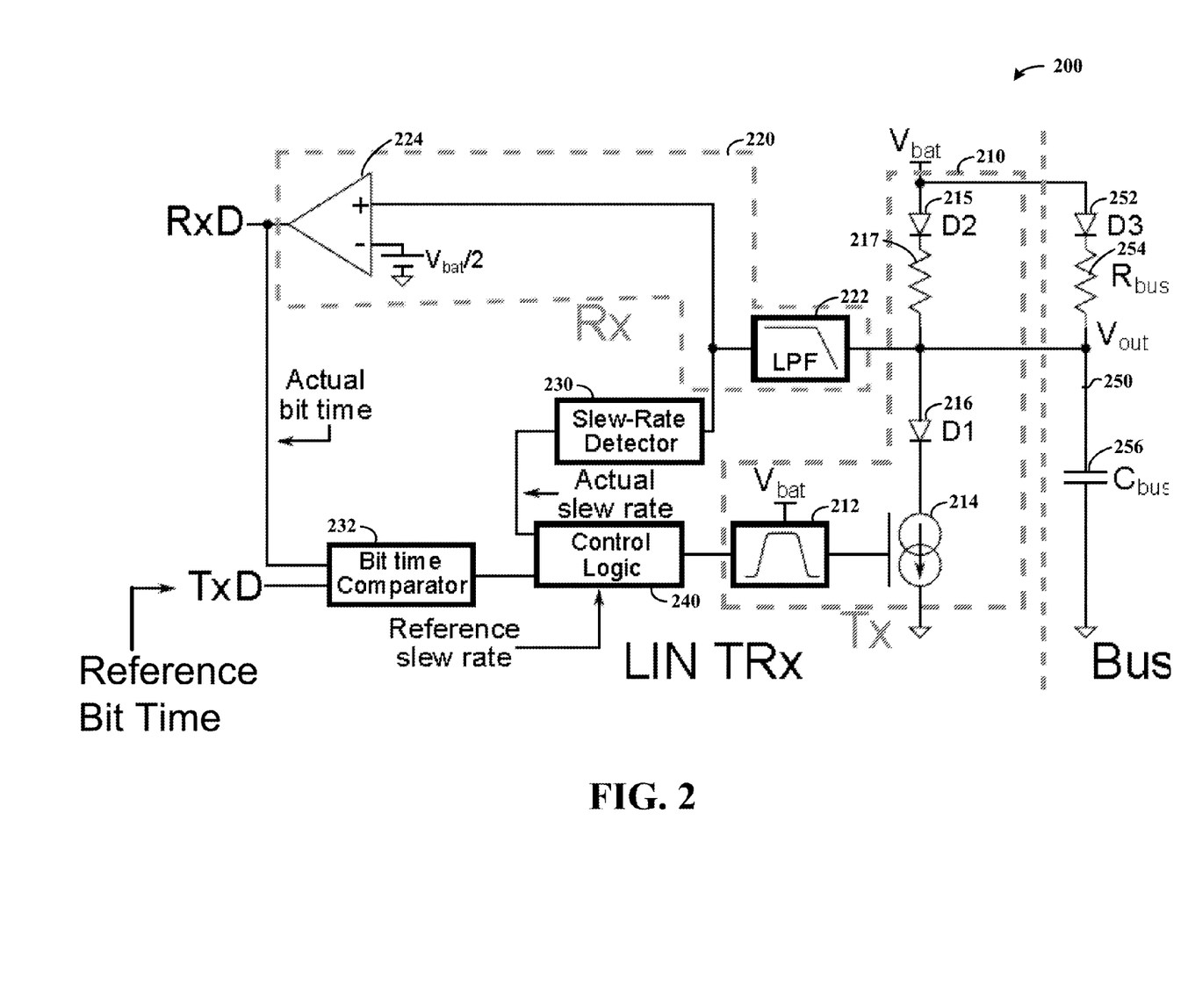
FIG. 2 shows another transceiver apparatus, in accordance with another example embodiment of the present invention.

FIG. 2 shows another transceiver apparatus 200, in accordance with another example embodiment of the present invention. The apparatus 200 includes a transmitter 210 and a receiver 220 that communicate on a bus 250, such as a single-wire bus. The transmitter 210 includes a wave-shaping circuit 212 that generates a signal for communication on the bus 250, and other circuitry that facilitates the communication (shown by way of example as including voltage-controlled current source 214 and diodes 215 and 216, and resistor 217 (e.g., 30 kΩ)). The receiver 220 includes a low-pass filter 222 and a voltage comparator 224 that provides an actual bit time output based upon signals carried on the bus 250 as passed via the low-pass filter. The apparatus 200 also includes a slew-rate detector 230, which may be implemented with the receiver 220, and which detects a slew rate of signals carried on the bus 250 based upon rise and/or fall times of the signal, and provides an actual slew-rate output indicative of the detected slew rate. A bit time comparator 232 is coupled to receive the actual bit time output from the voltage comparator 224 and a reference bit time from an input signal TxD, and compares the reference and actual bit times of the signal TxD as transmitted on the bus 250. In certain embodiments, the bit time comparator 232 is implemented as part of the receiver 220.

The apparatus further includes a control logic block 240, which is coupled to receive the actual output of the bit time comparator 232, and to receive the slew-rate output from the slew-rate detector 230. In some implementations, the bit time comparator 232 is implemented within the control logic block 240, which is then coupled to receive the actual bit time output from the voltage comparator 224.

The control logic block 240 operates to drive the wave-shaping circuit 212 in the transmitter, based upon the bit time and slew-rate outputs, and therein compensating for variations on the bus 250 such as those discussed above (e.g., relating to bus circuitry and/or connected components thereto). The control logic block 240 determines a bit-time adjustment for driving the wave-shaping circuit 212 in one or more manners, such as by comparing the bit time output with a reference bit time drawn from a transmit data (TxD) signal passed on the bus 250, to determine changes in bit time that occur due to bus variations. The control logic block 240 also determines a slew-rate adjustment for driving the wave-shaping circuit 212 in one or more manners, such as by comparing the slew-rate output to a reference slew rate. These respective comparisons can be used to set/control a current plateau used in driving the wave-shaping circuit 212 and, therein, the signal on the bus 250 (e.g., via current source 214). Moreover, the wave-shaping circuit 212 may be implemented using one or more of a variety of circuits and approaches, such as with an electronic circuit that creates or modifies a time-varying signal characteristic relating to voltage and/or current, using one or more electronic devices such as transistors, inductors, resistors and capacitors.

The apparatus 200 is implemented for communications with a variety of types of communication links, in connection with various embodiments. By way of example, FIG. 2 shows communication on single-wire bus 250 having diode 252, resistor 254 (e.g., 1 k-500Ω), and capacitor 256 (e.g., 1 n-10 nF). Such an implementation may involve a bus such as a LIN bus, in accordance with one or more of the referenced LIN-based documents cited herein. In some embodiments, the apparatus 200 is integrated within one or more of a master circuit that communicates on such a single-wire bus, and slave circuits connected in series with the master circuit on the bus (e.g., with separate ones of the apparatuses 200 implemented in two or more of the master/slave circuits).

Figure 3:
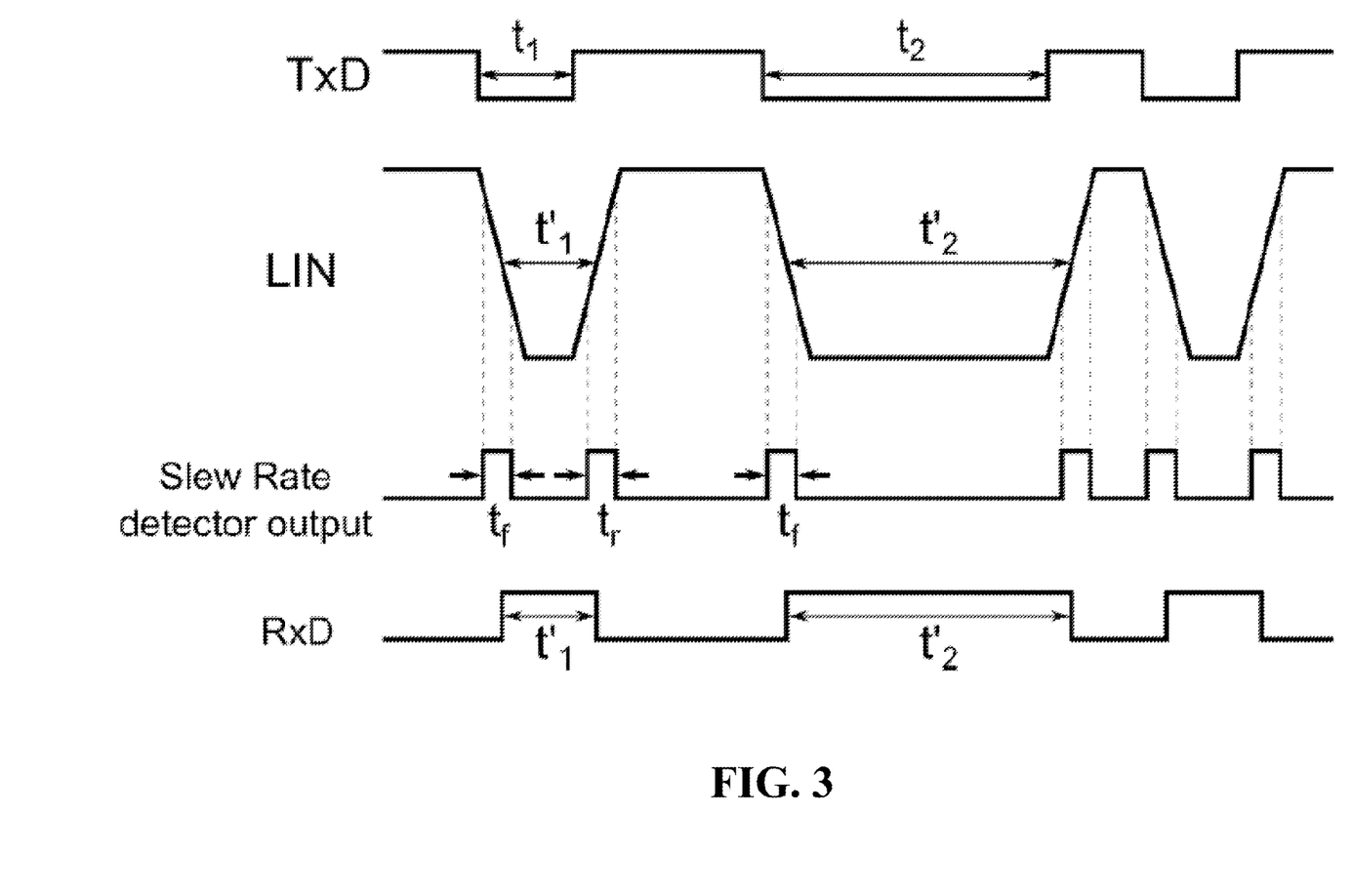
FIG. 3 shows a timing diagram for operation of a transceiver, in accordance with another example embodiment of the present invention.

FIG. 3 shows a timing diagram for operation of a transceiver, in accordance with another example embodiment of the present invention. In some embodiments, the timing aspects shown in FIG. 3 are implemented in connection with the apparatus shown in FIG. 2, with the commonly-labeled plots being implemented as shown therein. By way of example, the following describes the implementation of the timing diagram in connection with FIG. 2, with the understanding that various embodiments may be implemented with other communication circuits, such as shown in FIG. 1.

The upper plot shows a transmit data (TxD) input signal as used to drive the transmission of a signal on the bus 250 by the wave-shaping circuit 212. A first bit has duration $t_1$ and a second bit has duration $t_2$ as received for transmission. The transmitter 210 shifts this signal into a battery-voltage domain and shapes the transitions, with the resultant waveform on the LIN bus being denoted by waveform 'LIN' in FIG. 3. The respective durations $t_1'$ and $t_2'$ are offset relative to slew as shown.

The control logic 240 is fed by the output signal from the slew-rate detector 230 (actual slew rate) and from the voltage comparator 224 (actual bit time), represented in the FIG. 3 plot labeled as Slew Rate detector output, with $t_f$ denoting fall time and $t_r$ denoting rise time, as aligned with the fall and rise of the signal LIN. Plot RxD represents the respective signals as received on the bus, as altered relative to characteristics of the bus. The fall time is extracted from the RxD signal, the rise time and bit time are extracted from the output of the low-pass filter 222, and the control logic 240 compares these times to references in order to determine whether the output signal on the bus is properly shaped. Based on this comparison, the control logic 240 drives the transceiver 210 (and wave-shaping circuit 212) to correct discrepancies.

Figure 4:
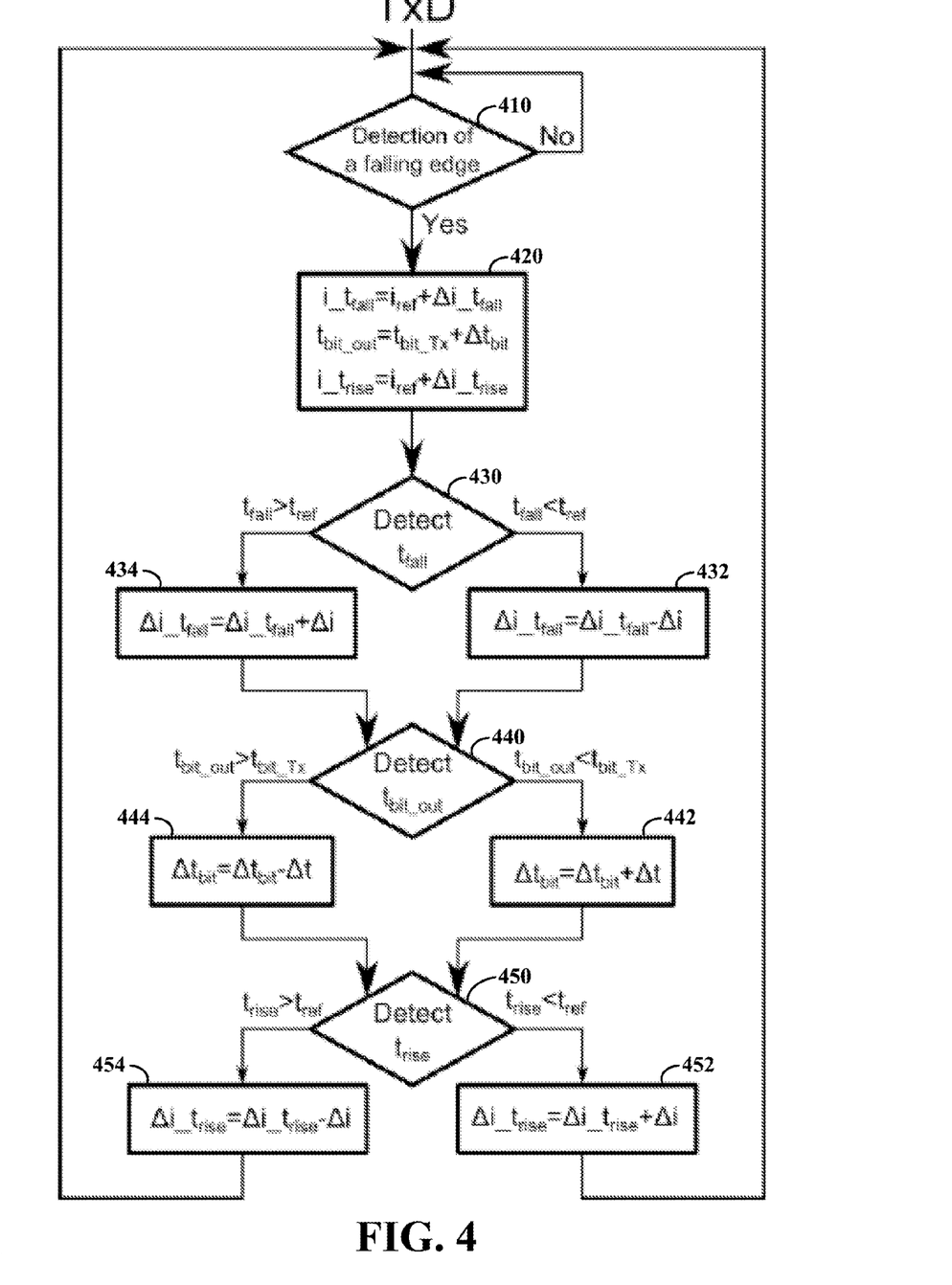
FIG. 4 shows a flow diagram for operation of a transceiver, in accordance with another example embodiment of the present invention.

The respective bit time, rise time and fall time are implemented to control/drive a transmitter in one or more of a variety of manners. One such embodiment is depicted in FIG. 4, which shows a flow diagram for operation of a transceiver. The fall time, the bit time and the rise time are measured during the transmission of a bit. If a falling edge of a signal carried on a bus is detected at block 410, the fall current, bit time and rise current are obtained as shown at block 420. If a fall time shorter than the reference is detected at block 430, the amplitude of the current plateau used to drive the signal on the bus is decreased at block 432 to $\Delta i\_t_{fall} = \Delta i\_t_{fall} - \Delta i$, where $\Delta i$ is a current step (e.g., predefined). If the fall time is greater than a reference time at block 430, then the amplitude of the current plateau is increased at block 434 to $\Delta i\_t_{fall} = \Delta i\_t_{fall} + \Delta i$.

For bit time adjustment, if the detected bit time is less than the transmitted (e.g., derived from the TxD input signal shown in FIG. 2) or reference bit time at block 440, the bit time is increased at block 442 by an amount $\Delta t$ (e.g., a pre-determined time change), such that $\Delta t_{bit} = \Delta t_{bit} + \Delta t$ (e.g., where $\Delta t_{bit}$ is a previous adjustment). If the detected bit time is greater than the transmitted or reference bit time at block 440, the bit time is decreased at block 444 by the $\Delta t$, such that $\Delta t_{bit} = \Delta t_{bit} - \Delta t$. Where the transmitted bit time is used as the reference, the regulation scheme may be applied with any bit time or bit rate. Such bit-time regulation can be used to facilitate immunity against RF disturbances, as the effect of the distortion on the timing can be compensated.

For rise time adjustment, if the detected rise time is less than a reference rise time at block 450, the amplitude of the current plateau used to drive the signal on the bus is increased at block 452 to $\Delta i\_t_{rise} = \Delta i\_t_{rise} + \Delta i$. If the detected rise time is greater than a reference rise time at block 450, the amplitude of the current plateau is decreased at block 454 to $\Delta i\_t_{rise} = \Delta i\_t_{rise} - \Delta i$.

The above corrections are effective as soon as another bit is transmitted, after which the process can continue again at block 410. In some embodiments, after the transmission of a certain number of bits, the average value of the respective fall time, bit time and rise time are stabilized.

Figure 5:
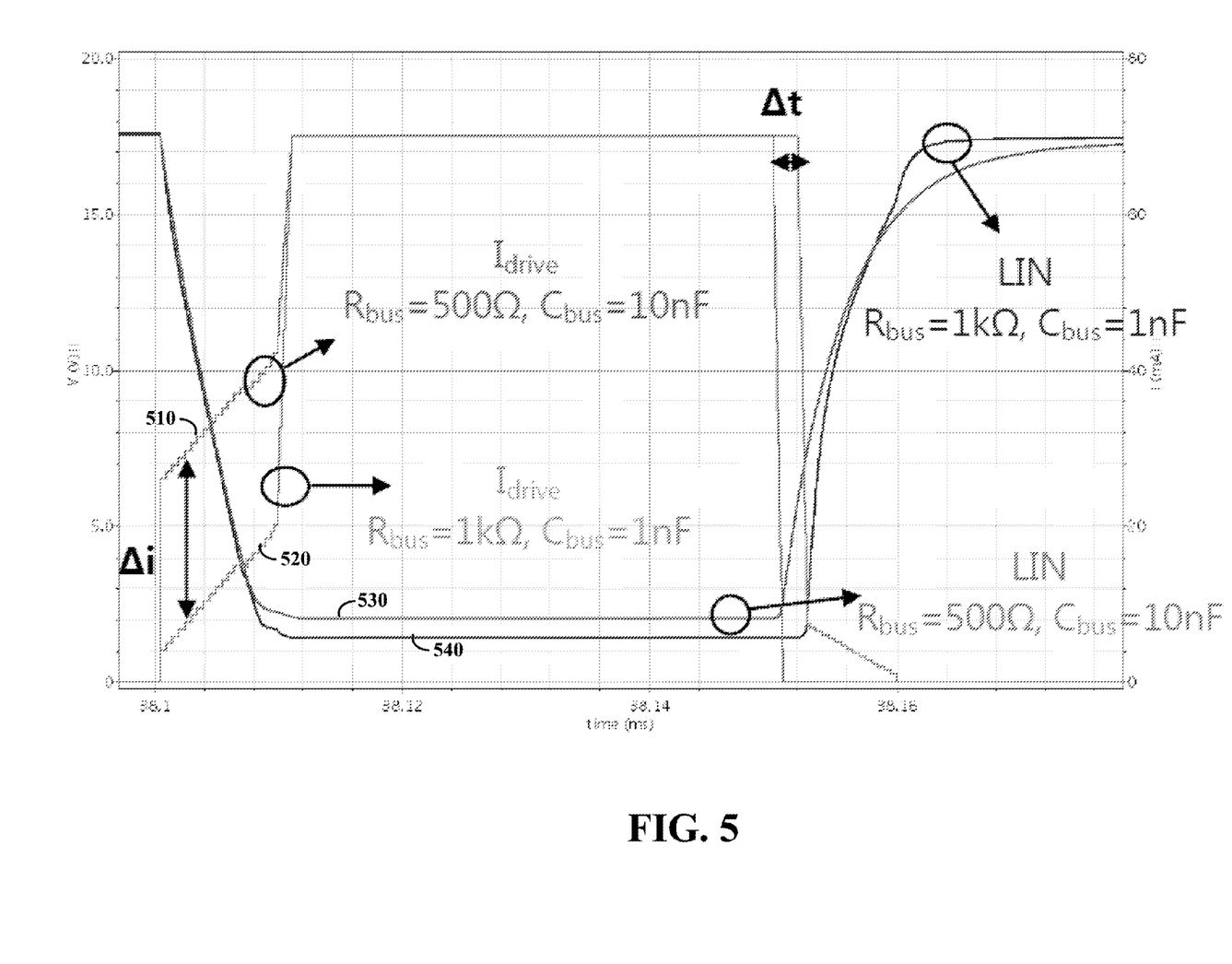
FIG. 5 shows plots of output voltage and the driving current for operation of a transceiver, in accordance with another example embodiment of the present invention.

FIG. 5 shows plots of voltage over time for operation of a transceiver during the transmission of a dominant state for different bus-load conditions, in accordance with another example embodiment of the present invention. By way of example, plots 510 and 530 respectively show drive current and the resulting signal LIN with an apparatus and bus as shown in FIG. 2 in which resistor 254 is 500Ω and capacitor 256 is 10 nF, and plots 520 and 540 show drive current in which resistor 254 is 1 kΩ and capacitor 256 is 1 nF. The output current waveform is defined by fixed transition times ($t_{fall}$ and $t_{rise}$) and a variable bit time (illustrated by $\Delta t$). The fall time and the rise time are controlled by changing the amplitude of a current plateau ($\Delta i$). The bit time can be corrected if the control detects a mismatch between the timing on TxD and RxD. Such an approach can be implemented with an apparatus as described herein, such as with a data-transmission circuit and feedback circuit that control the fall time and the rise time by changing the amplitude of a current plateau used to drive the output waveform, and controlling the bit time based upon a comparison between a detected bit time of a signal detected by the feedback circuit and a bit time of a signal transmitted by the data-transmission circuit.

Figure 6:
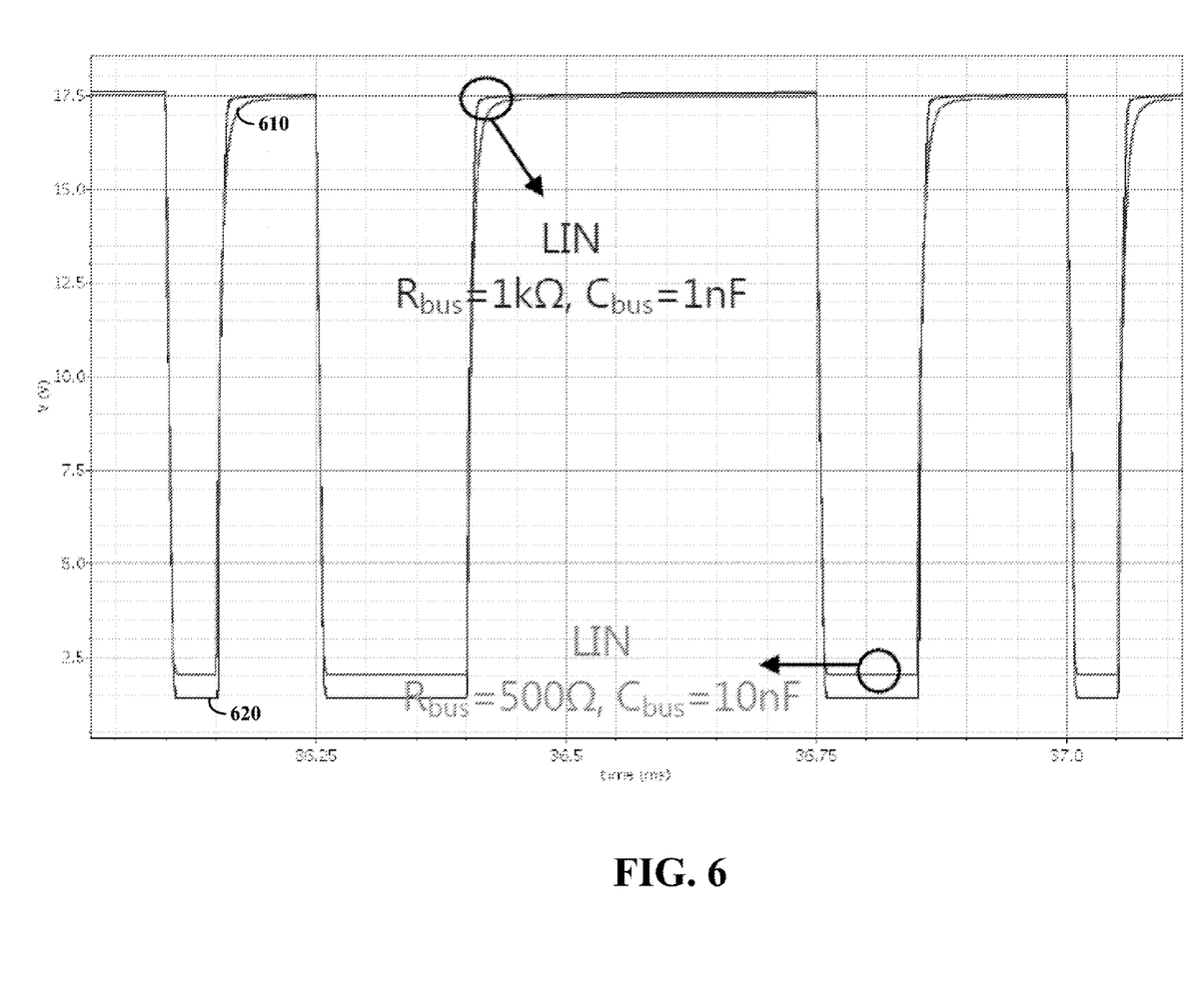
FIG. 6 shows plots of voltage over time for operation of a transceiver, in accordance with another example embodiment of the present invention.

FIG. 6 shows plots of voltage over time for operation of a transceiver, in accordance with another example embodiment of the present invention. By way of example, plots 610 and 620 respectively show the resulting signal LIN with an apparatus and bus as shown in FIG. 2 in which resistor 254 is 1 kΩ and capacitor 256 is 1 nF, and in which resistor 254 is 500Ω and capacitor 256 is 10 nF. Approaches as described herein, such as in FIGS. 4 and 5, are implemented to ensure the operation of the transceiver under the varying bus load conditions, represented by the values of the resistor 254 and capacitor 256, with little mismatch between the plots 610 and 620 in terms of slew rate and bit time.

For general information regarding LIN networks, and for specific information regarding aspects of LIN networks in which various example embodiments of the present invention may be implemented, and also regarding transceivers, wave-shaping and other circuits as discussed herein, reference may be made to: the LIN Specification Version 2.0 (and other versions thereof), available from the LIN Consortium of Munich, Germany; "Hardware Requirements for LIN, CAN and FlexRay Interfaces in Automotive Applications, Audi; BMW; Daimler; Porsche & Volkswagen," rev 1.2, 2011; An EMI Resisting LIN Driver in 0.35-micron High-Voltage CMOS, Redoute, J. M. and Steyaert, M., IEEE journal of Solid-State Circuits, vol 42, pp 1574-1582, 2007; and U.S. Pat. No. 7,688,113B2, all of which are fully incorporated herein by reference.

Various blocks, modules or other circuits may be implemented to carry out one or more of the operations and activities described herein and/or shown in the figures. In these contexts, a "module" or "block" is a circuit that carries out one or more of these or related operations/activities (e.g., detecting bus characteristics, comparing bit timing, determining slew rates, or using such information to drive an output). For example, in certain of the above-discussed embodiments, one or more modules are discrete logic circuits or programmable logic circuits configured and arranged for implementing these operations/activities, as in the circuit modules shown in FIG. 1. In certain embodiments, such a programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a CPU hardware-based circuit and a set of instructions in the form of firmware, where the first module includes a first CPU hardware circuit with one set of instructions and the second module includes a second CPU hardware circuit with another set of instructions.

Certain embodiments are directed to a computer program product (e.g., nonvolatile memory device), which includes a machine or computer-readable medium having stored thereon instructions which may be executed by a computer (or other electronic device) to perform these operations/activities.

Based upon the above discussion and illustrations, those skilled in the art will readily recognize that various modifications and changes may be made to the various embodiments without strictly following the exemplary embodiments and applications illustrated and described herein. For example, various LIN-based applications can be used in other communication systems. As another example, various current sources may be used, such as by implementing parallel current sources to effect functionality as shown and described in connection with current source 214. In addition, various embodiments may be combined to operate together and/or to implement circuits or other components from another embodiment. Such modifications do not depart from the true spirit and scope of various aspects of the invention, including aspects set forth in the claims.

What is claimed is:

1. An apparatus for communicating in a network including a master circuit and a plurality of slave circuits on bus that is controlled by the master circuit corresponding to master and slave data communication, the apparatus comprising:
   a feedback circuit configured and arranged to provide a feedback signal indicative of a slew rate and bit time of signals communicated in the network between the master and slave circuits on the bus; and
   a data-transmission circuit responsive to an input signal and a feedback signal received from the feedback circuit, the data-transmission circuit configured and arranged to
      communicate data over the bus using control provided by the master circuit, and
      transmit data on the bus by generating output signals via a waveform corresponding to the input signal, and controlling the waveform based upon the slew rate and bit time on the bus and indicated via the feedback signal,
   wherein the data-transmission circuit is configured and arranged to control the waveform based upon deviations in the slew rate and bit time indicated via the feedback signal.

2. The apparatus of claim 1, wherein the feedback circuit is configured and arranged to detect fall time, the bit time and rise time of signals carried on the bus during the transmission of a bit, and to provide the feedback signal to drive the data-transmission circuit to control the output waveform by:
   in response to the rise time being shorter than a reference value, transmitting a bit by increasing an amplitude of current used to drive the output waveform by a first step value,
   in response to the fall time being shorter than the reference value, transmitting a bit by decreasing an amplitude of current used to drive the output waveform by the first step value, and
   detecting the one of the rise time and the fall time of a signal carrying one of the bits and adjusting the amplitude of current used to drive the output waveform based upon the one of the rise time and the fall time of the signal carrying the one of the bits.

3. The apparatus of claim 1, wherein the feedback circuit is configured and arranged to provide the feedback signal by comparing a bit time of one of the signals on the bus with a reference bit time that is derived from a data signal transmitted by the data-transmission circuit on the bus, the feedback signal being responsive to impedance changes on the bus.

4. The apparatus of claim 1, wherein
   the feedback circuit includes
      a receiver circuit configured and arranged to receive signals passed on the bus, and
      a slew-rate detector circuit configured and arranged to detect a slew-rate of signals carried on the bus, and
   the data-transmission circuit includes
      a wave shaping circuit configured and arranged to control the output waveform, and
      a control logic block configured and arranged to drive the wave shaping circuit to adjust the output waveform based upon the detected slew-rate of a signal carried on the bus.

5. The apparatus of claim 1, wherein the data-transmission circuit is configured and arranged to compensate for bus-load variations by controlling the output waveform to facilitate communications on the bus based on a predefined slew-rate threshold.

6. The apparatus of claim 1, wherein the data-transmission circuit is configured and arranged to control the output waveform by adjusting the output waveform based upon the bit time indicated in the feedback signal to set a bit time of the generated signals that remains constant during high frequency interference on the bus.

7. The apparatus of claim 1, wherein the output waveform is defined by fixed rise and fall transition times and a variable bit time, and the data-transmission circuit and feedback circuit are configured and arranged to control the fall time and the rise time by changing the amplitude of a current plateau used to drive the output waveform, and to control the bit time based upon a comparison between a detected bit time of a signal detected by the feedback circuit and a bit time of a signal transmitted by the data-transmission circuit.

8. The apparatus of claim 1, wherein
   the bus is a single-wire bus,
   the master and slave circuits are connected in series on the bus, and
   the master circuit includes the feedback circuit and the data-transmission circuit, and is configured and arranged to initiate all communications on the single-wire bus.

9. The apparatus of claim 4, wherein
   the feedback circuit includes a bit time detector circuit configured and arranged to compare the bit time on the received signals with the bit time of signals transmitted by the data-transmission circuit, and
   the control logic block is configured and arranged to drive the wave shaping circuit in response to the comparison.

10. The apparatus of claim 4, wherein the receiver circuit includes a low-pass filter and a voltage comparator that are configured and arranged to receive the signals passed on the bus and to compare the bit time of the respective signals.

11. An apparatus comprising:
   a wave-shaping circuit configured and arranged to generate signals via an output waveform and to transmit the generated signals on a bus;
   a slew-rate detection circuit configured and arranged to detect fall time and rise time of signals carried on the bus and indicative of a slew rate of the signals;
   a comparator circuit configured and arranged to provide a bit time of signals received from the bus; and
   a control logic circuit configured and arranged to receive and use data indicative of the detected fall time, rise time and bit time to control the wave-shaping circuit to generate the signals based on:
      a transmission signal to be transmitted on the bus,
      a slew rate associated with one of the detected fall time and the detected rise time, and
      a comparison of the bit time with a reference bit time of signals transmitted via the apparatus on the bus,
   wherein the wave-shaping circuit is configured and arranged to control the output waveform based upon deviations in the slew rate and the bit time.

12. The apparatus of claim 11, further including
   the bus, the bus being a single-wire bus,
   a master circuit, and
   a plurality of slave circuits connected in series with the master circuit on the single-wire bus, one of the master circuit and the plurality of slave circuits having the wave-shaping circuit, the slew-rate detection circuit, the comparator circuit and the control logic circuit.

13. The apparatus of claim 11, wherein the control logic circuit is configured and arranged to detect the difference between the bit time and the bit time of signals transmitted via the apparatus.

14. The apparatus of claim 11, wherein the control logic circuit is configured and arranged to control the wave-shaping circuit to generate signals by:
- in response to the rise time being shorter than a reference value, increasing an amplitude of current used to generate the signals by a first step value and transmitting a bit on the bus using the increased amplitude,
- in response to the fall time being shorter than the reference value, decreasing the amplitude of the current used to generate the signals by the first step value and transmitting a bit on the bus using the decreased amplitude, and
- detecting one of the rise time and the fall time of a signal carrying the bit, and adjusting the amplitude of current used to drive the output waveform based upon one of the rise time and the fall time of the signal carrying the bit.

15. A method for communicating in a network including a master circuit and a plurality of slave circuits on bus that is controlled by the master circuit corresponding to master and slave data communication, the method comprising, in one of the master and slave circuits:
- providing feedback signals indicative of a slew rate and bit time of signals communicated in the network between the master and slave circuits on the bus; and
- in response to an input signal and the feedback signal,
  - communicating data over the bus using control provided by the master circuit,
  - transmitting data on the bus by generating output signals via a waveform corresponding to the input signal, and controlling the waveform based upon the slew rate and bit time on the bus and indicated via the feedback signal; and
  - controlling the waveform based upon deviations in the slew rate and bit time indicated via the feedback signals.

16. The method of claim 15, further including detecting fall time, the bit time and rise time of signals carried on the bus during transmission of a bit, wherein transmitting data on the bus includes
- in response to the rise time being shorter than a reference value, transmitting a bit by increasing an amplitude of current used to drive the output waveform by a first step value,
- in response to the fall time being shorter than the reference value, transmitting a bit by decreasing an amplitude the current used to drive the output waveform by the first step value,
- detecting one of the rise time and the fall time of a signal carrying one of the transmitted bits, and
- adjusting the amplitude of current used to generate the waveform based upon the detected one of the rise time and the fall time.

17. The method of claim 15, wherein providing the feedback signal includes comparing a bit time of one of the signals on the bus with a reference bit time that is derived from a data signal transmitted on the bus, the feedback signal being responsive to impedance changes on the bus.

18. The method of claim 15, further including comparing the slew rate with a threshold slew rate, wherein transmitting data includes modifying the waveform in response to the comparison indicating that the slew rate of a signal carried on the bus is greater than the threshold slew rate.

19. The method of claim 15, wherein
- generating output signals via a waveform includes generating the waveform with fixed rise and fall transition times and a variable bit time, and
- controlling the waveform includes controlling the fall time and the rise time by changing an amplitude of a current plateau used to generate the waveform, and controlling the bit time based upon a comparison between a bit time indicated in the feedback signal and a bit time of a signal transmitted by the one of the master and slave circuits.

\* \* \* \* \*